(12) United States Patent  
Evans et al.

(10) Patent No.: US 6,255,602 B1  
(45) Date of Patent: Jul. 3, 2001

(54) MULTIPLE LAYER ELECTRICAL INTERFACE

(75) Inventors: Stephen Evans, Newtown; Anthony Paul Martel, New Fairfield, both of CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 09/270,472

(22) Filed: Mar. 15, 1999

(51) Int. Cl.[7] ............................... H01R 9/09; H01K 1/18
(52) U.S. Cl. .................. 174/262; 174/261; 174/266; 361/778; 361/795; 257/698
(58) Field of Search .................... 174/262, 261, 174/266; 361/778, 792, 795, 794, 780; 257/698; 29/852, 847

(56) References Cited

U.S. PATENT DOCUMENTS

| | | | |
|---|---|---|---|
| 3,564,114 | * | 2/1971 | Blinder ................................ 174/254 |
| 3,654,585 | | 4/1972 | Wickersham ...................... 339/17 M |
| 3,806,801 | | 4/1974 | Bove .................................... 324/72.5 |
| 3,911,361 | | 10/1975 | Bove et al. ........................ 324/158 P |
| 4,027,935 | | 6/1977 | Byrnes et al. .......................... 339/48 |
| 4,038,599 | | 7/1977 | Bove et al. ............................ 324/158 |
| 4,458,297 | * | 7/1984 | Stopper et al. ....................... 361/771 |
| 4,524,240 | * | 6/1985 | Stock et al. .......................... 174/254 |
| 4,764,644 | | 8/1988 | Reisman et al. .................... 174/68.5 |
| 4,792,779 | | 12/1988 | Pond et al. ........................... 338/195 |
| 4,868,980 | * | 9/1989 | Miller, Jr. ............................. 29/850 |
| 4,888,665 | * | 12/1989 | Smith ................................... 361/780 |
| 4,901,013 | | 2/1990 | Benedetto et al. ................... 324/158 |
| 5,132,878 | * | 7/1992 | Carey ................................... 361/778 |
| 5,144,228 | | 9/1992 | Sorna et al. ......................... 324/158 |
| 5,264,729 | * | 11/1993 | Rostoker et al. .................... 257/774 |
| 5,282,312 | | 2/1994 | DiStefano et al. .................... 29/830 |
| 5,534,784 | | 7/1996 | Lum et al. ........................... 324/757 |
| 5,544,018 | * | 8/1996 | Sommerfeldt et al. ............. 361/792 |
| 5,583,321 | * | 12/1996 | DiStefano et al. .................. 174/264 |
| 5,640,308 | * | 6/1997 | Osann, Jr. et al. .................. 361/777 |
| 5,808,351 | * | 9/1998 | Nathan et al. ....................... 257/528 |

* cited by examiner

Primary Examiner—Albert W. Paladini  
Assistant Examiner—J B Patel  
(74) Attorney, Agent, or Firm—William C. Crutcher

(57) ABSTRACT

A universal design of a multiple layer printed circuit board incorporates a series of routing vias interconnecting the various layers. The routing vias are connected to conductive traces in the internal trace layers by internal junctions. The internal junctions are located on the via so that internal junctions may be selectively severed by means of a laser or high pressure water cutting system or other fine line cutting tool or mechanism to customize the circuit design for a particular semiconductor device or integrated circuit.

13 Claims, 11 Drawing Sheets

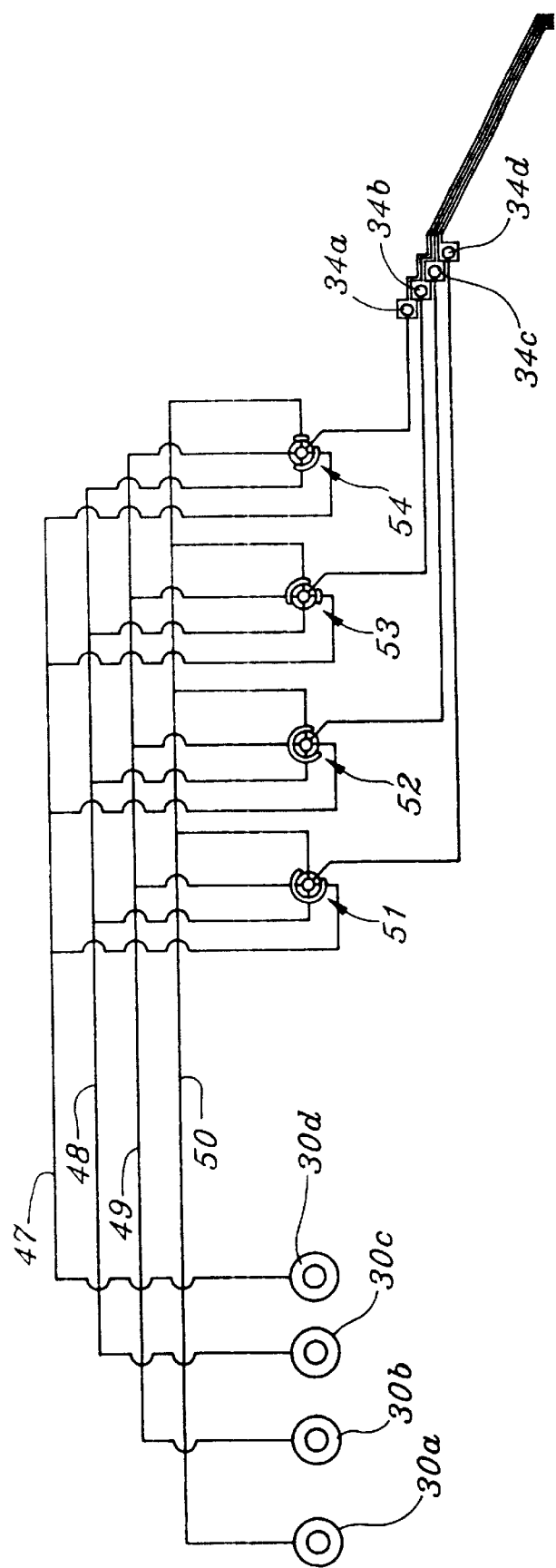

MULTIPLE LAYER ELECTRICAL INTERFACE

This invention relates generally to a multiple layer electrical interface for testing semiconductors and integrated circuits, and more particularly to a universal interface which may be mass produced and then customized for a particular semiconductor device or integrated circuit.

BACKGROUND OF THE INVENTION

Printed circuit boards are manufactured by creating an artwork and etching copper away from the non-current carrying portions of the board. This process is non-reversible; hence, once the printed circuit board is etched it is then customized or "dedicated" to a certain semiconductor device/integrated circuit and cannot be changed without modification of the artwork and re-fabrication of the printed circuit board.

One particular use of printed circuit boards is that of an interface or interconnection device known as a "space transformer" for connecting a vertical pin integrated circuit probing device to the integrated circuit test equipment. As the number and density of connection pads increase on integrated circuits, special multiple probe devices have been devised for holding the probes in a predetermined pattern corresponding to the integrated circuit to be tested, and slidably supporting the probes, which are constructed as vertical pins. The test device is moved against the bottom ends of the probe pins while contact is maintained with the exposed upper heads of the pins. The type of probe head thus constructed was developed by IBM and is described in a number of U.S. Patents including, for example, U.S. Pat. No. 3,806,801 describing an earlier construction, and U.S. Pat. No. 4,027,935. This type of probe holder, which is sometimes referred to as a vertical-pin integrated circuit probing device and sometimes as a hybrid buckling beam probe has been improved by IBM and other manufacturers. Such a device is manufactured and sold by applicant's assignee as a COBRA® probe, and is used in conjunction with a printed circuit test board, which is connected in test circuit relationship with the external test equipment for testing the integrated circuit.

Inasmuch as the matrix or pattern of exposed heads of the vertical-pin probes is relatively small and dense, and must be connected to a larger pattern of traces (PCB traces) on the printed circuit test board, an interconnection device commonly known as a "space transformer" is generally employed. Various types of space transformers are shown in the prior art, for example in U.S. Pat. No. 4,038,599 issued Jul. 26, 1977 to Bove et al., U.S. Pat. No. 3,654,585 issued Apr. 4, 1972 to Wickersham, U.S. Pat. No. 3,911,361 issued Oct. 7, 1975 to Bove et al., and U.S. Pat. No. 4,901,013 issued Feb. 13, 1990 to Benedetto et al. A common type of prior art space transformer comprises a wired interface used together with an etched "dedicated" printed circuit board is depicted in FIGS. 1a and 1b of the present application.

The prior art drawings of FIG. 1a and FIG. 1b schematically illustrate a silicon wafer 10 having a number of integrated circuit devices thereon with contact pads 12 to be probed. Multiple power, ground and signal potentials are supplied from test equipment through connectors 14 to "pogo pads" on the outer periphery of a printed circuit board 16. A particular pattern of test circuit dedicated to a particular pattern of contact pads 12 on the integrated circuit device is provided by means of traces 18 etched into or deposited on the printed circuit board. A second set of wire leads 20 connected to the etched traces 18 terminate on the underside of board 16, so as to make contact at 19 with the upper ends of probe pins 22 held in a probe assembly 24.

While the simple construction of FIGS. 1a and 1b may have been adequate for integrated circuit devices in the past, the complexity of the test circuits and density of the devices on the silicon wafer has greatly challenged the probe card manufacturer. As the probe card designs become more complex, they become more expensive. Once dedicated to a particular integrated circuit, they can no longer be used if the integrated circuit is modified.

It is known that complex circuit designs can be simplified by using multiple layer printed circuit boards in which, for example, multiple layers of conductive traces are interposed between insulating layers and used to carry the signal, power and ground paths. In order to reach the internal layers, conductors passing through the insulating layers, known as "vias" are used. Pin count or number of input/outputs (I/O) are increasing as each generation of semiconductor device/integrated circuit is introduced into the marketplace. Testers are introduced into the market with higher pin count capability in order to keep pace with the increased I/O of semiconductor devices. Most of these testers increase pin count in binary increments. The number of vias and the layout of these vias are also done on the basis of incremental binary additions.

Example: A new tester is introduced into the marketplace. The new tester is capable of 1024 signals in addition to all required power supplies and grounds. The older generation of testers may have been capable of 512 signals and required power supplies and grounds. The new tester dictates that the layout of vias must now be capable of routing 1024 signals rather than 512 signals and therefore the printed circuit must be capable of routing any of 1024 signals to any of 1024 pin locations.

Another problem is encountered with providing the conductive path from the trace on the top side of a printed circuit board to a location on the underside of the printed circuit board which corresponds to a contact pad on the silicon wafer. The prior art carried out this transition by means of separate wires (see reference number 20 in FIGS. 1a and 1b). Constructing an interface in this manner becomes extremely expensive when the number of contact pads on the device increases. Various suggestions to effect the space transformation have been proposed in the prior art, including a laminated interface proposed in co-pending application Ser. No. 09/186,084 in the names of A. P. Martel and F. T. McQuade filed Nov. 5, 1998 and assigned to the present assignee.

The aforementioned space transformer designs require a separate member to be attached to the center of the printed circuit board, and provision made for a conductive path between the trace termination on the printed circuit board to the underside of the board. The conductive path terminates at a pin location in a contact pattern or "footprint", where contact is made with the probe pins of the probe assembly. It would be desirable to simplify the process for running the final conductive path to the footprint or probe pin contact location.

Accordingly, one object of the present invention is to provide an improved multiple layer electrical interface for testing semiconductors and integrated circuits.

Another object of the invention is to provide an improved method of manufacturing an electrical interface and space transformer for use with vertical pin probe devices.

Another object of the invention is to reduce the cost associated with converting from one pin-out configuration to another when testing integrated circuits.

Another object of the invention is to reduce the cost of increasingly complex test circuit designs on a printed circuit probe card.

SUMMARY OF THE INVENTION

Briefly stated, a universal design of a multiple layer printed circuit board, incorporates a series of routing vias interconnecting the various layers. The routing vias are connected to conductive traces in the internal trace layers by internal junctions. The internal junctions are located on the via so that internal junctions may be selectively severed by means of a laser or high pressure water cutting system or other fine line cutting tool or mechanism to customize the circuit design for a particular semiconductor device or integrated circuit.

The improved electrical interface comprises a multiple layer, universally connected and selectively disconnectable circuit, comprising a laminated structure including a plurality of insulating layers having interposed therebetween a plurality of trace layers each trace layer comprising a plurality of conductive traces, a plurality of electrically conductive routing vias extending through the insulating layers of the laminated structure, each said routing via being connected to a said conductive trace in each of the trace layers by an internal junction, each internal junction between a trace and a routing via being spaced from each other internal junction between a trace and the routing via such that internal junctions may be selectively severed at a selected routing via to leave a first selected trace in one trace layer connected to a second selected trace in another trace layer, and entry and exit vias accessible from the outside of the laminated structure connected respectively to said first and second selected traces.

DRAWING

These and many other objects of the invention will be better understood by reference to the following description, taken in connection with the accompanying drawings, in which:

FIG. 1a is a schematic side elevational view in cross section of a prior art wafer probe test apparatus utilizing a wired space transformer and vertical pin probing device, FIG. 1b is a plan view of the prior art wired space transformer printed circuit board, FIGS. 2–6 are drawings of the invention before customizing or dedicating to test a specific integrated circuit or semiconductor device, in which:

FIG. 2 is a top plan view of a universal multilayer electrical interface according to the present invention, FIG. 3 is a bottom plan view of the electrical interface of FIG. 2, FIG. 4 is a side elevational view in cross section of a portion of the interface of FIG. 2 taken through the routing vias, FIG. 5a through FIG. 5f are top plan views of successive layers of traces on and within the multiple layer interface of FIG. 2, confined to the portion within phantom line V of FIG. 2, FIG. 6 is a schematic perspective view of routing vias and connected traces in successive layers, FIGS. 7–10 are drawings of the invention after dedicating the interface to a particular integrated circuit, in which:

FIG. 10 is a schematic circuit diagram, showing the interconnections between traces.

DESCRIPTION OF THE PREFERRED EMBODIMENT

Figure 1A:
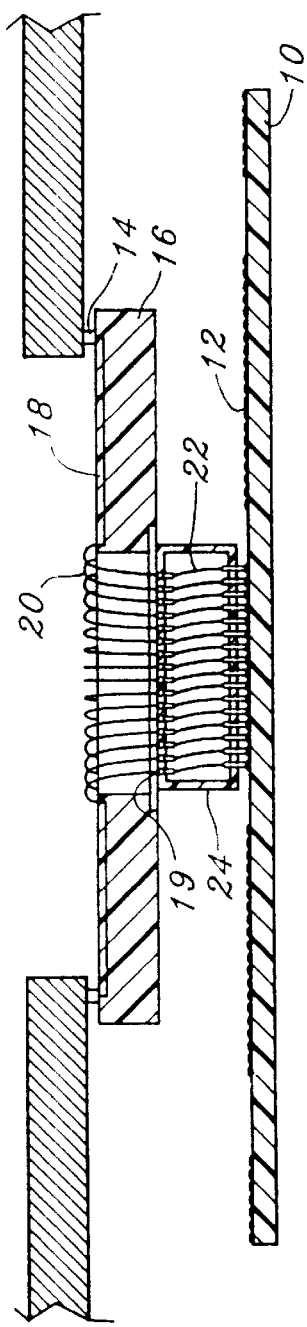
Figure 1B:
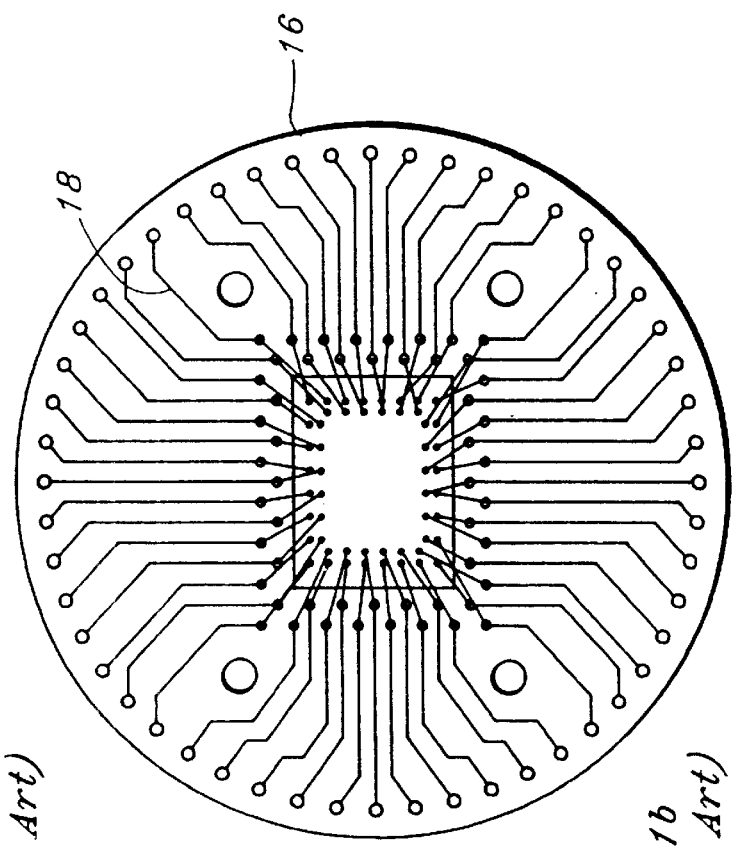

Referring to FIGS. 1a and 1b of the drawings illustrating the prior art, the space transformer 16 provides a test circuit connection between connectors 14 of the test equipment at the periphery of the board 16 to contact points 19 on the underside of the board, which make contact with the probe pins 22. The circuit connections between the upper ends of probe pins 22 and the contact pads 12 of the device under test are preselected and dedicated to the particular device under test, these being in usual practice a group of integrated circuits on a silicon wafer 10. The present invention is an improvement over the board 16 with its dedicated circuit and wired connections to contact points 19.

Figure 2:
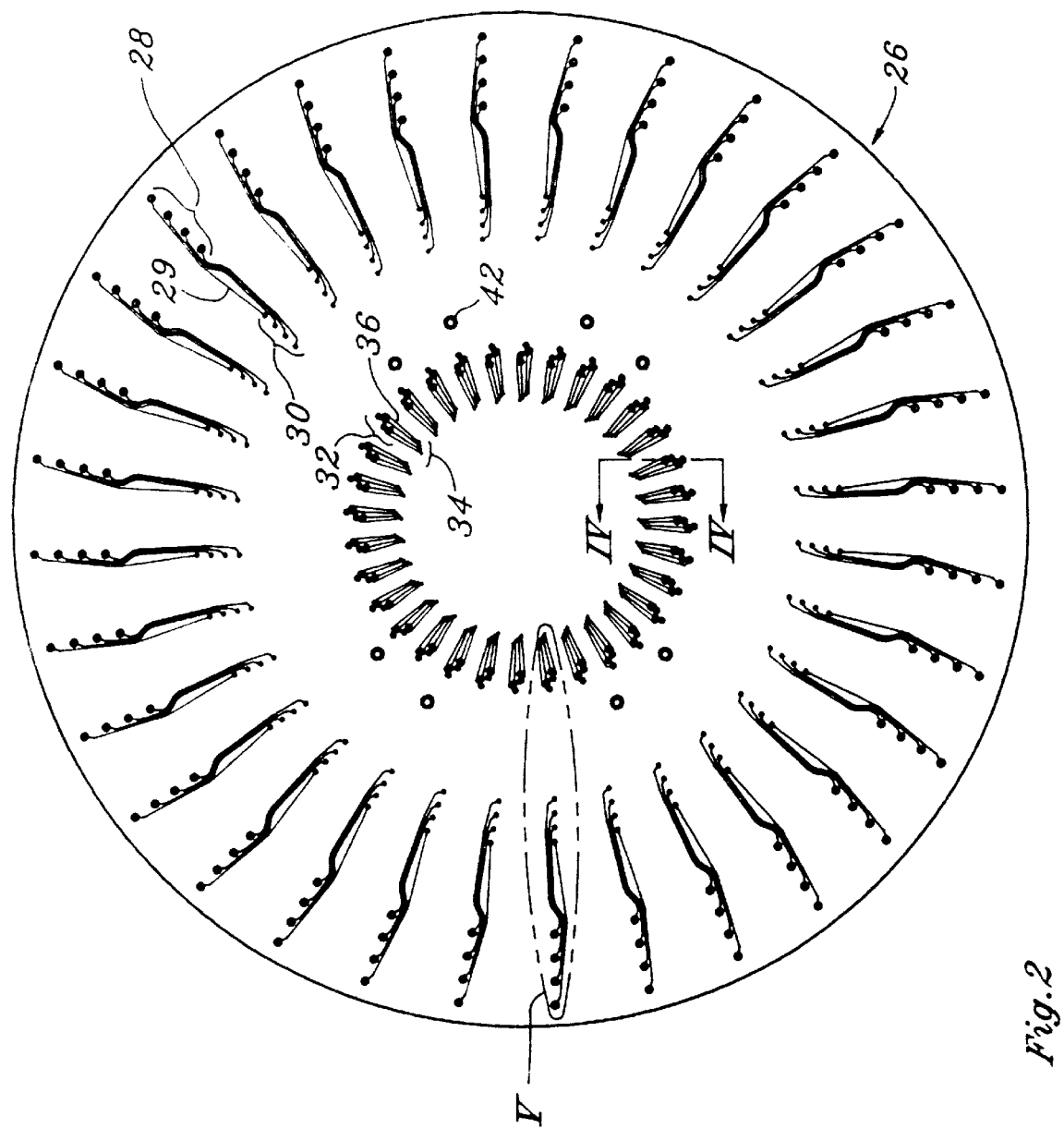
Figure 3:
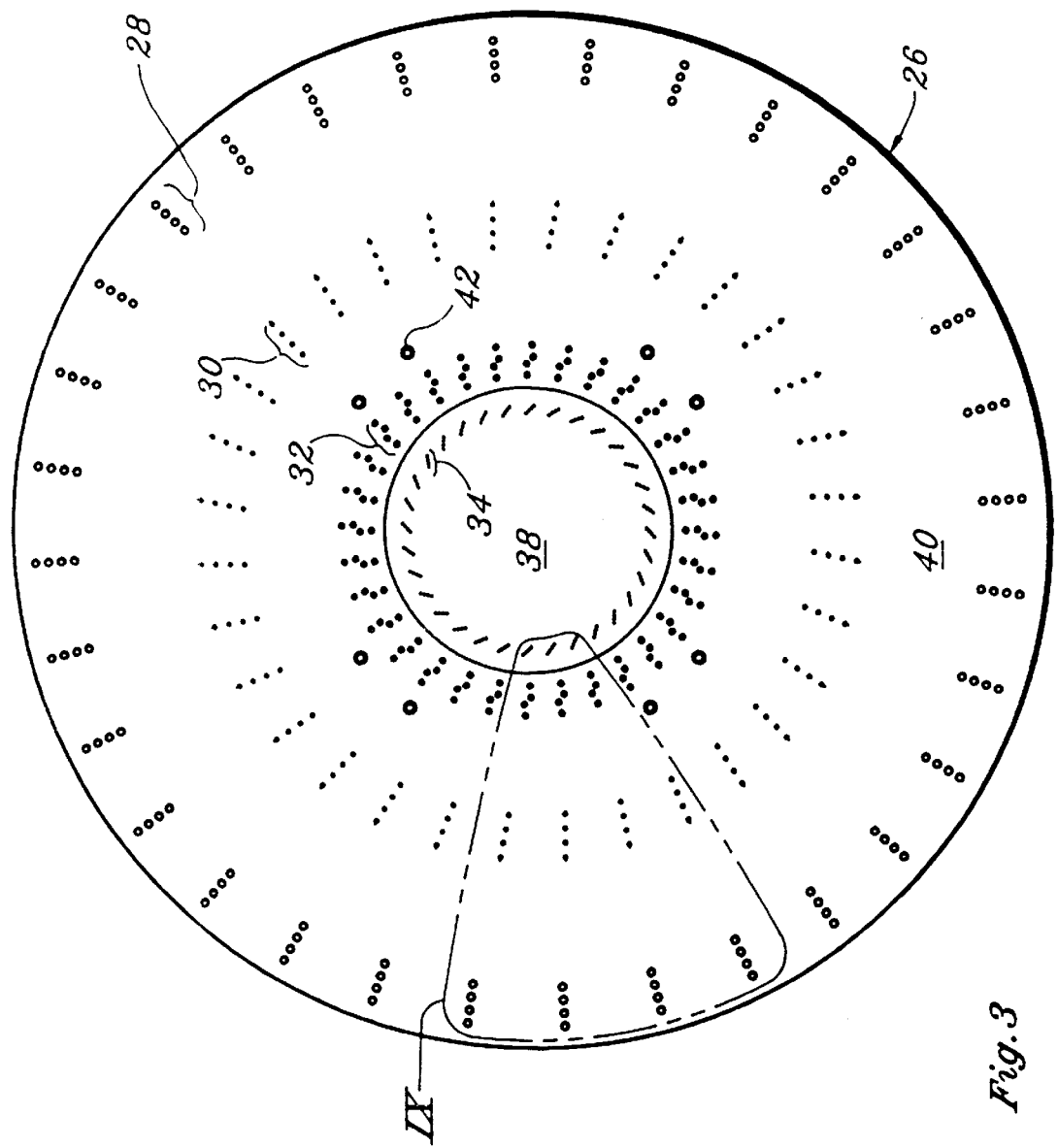

Referring to FIG. 2 of the drawing, a top plan view is shown of a universal multiple layer electrical interface, and FIG. 3 is a bottom plan view. The electrical interface board, is shown generally at reference number 26. Interface 26 is designed to provide a particular layout of vias and internal trace layers which provide the ability to customize the printed circuit board for optimum performance associated with the testing of semiconductors and integrated circuits. Interface 26 comprises an outer ring of groups of "pogo" pads 28, which are arranged to interface with a specific semiconductor test equipment model and type, so as to provide multiple power, ground and signal sources to pogo pads 28. Concentrically disposed inside of the ring of pogo pads 28 is a ring of groups of entry vias 30, each pogo pad in group 28 being connected to an entry via in group 30 by a respective trace 29 deposited on the insulating surface of interface 26.

Disposed inside of the ring of entry vias 30 is a concentric ring of groups of routing vias 32, which are universally interconnected with the entry vias 30 in a manner to be explained. Inward of the group of routing vias 32 is a concentric ring of groups of exit vias 34. Each of the routing vias in 32 is connected only to a respective exit via 34 by means of a conductive trace 36 applied to the surface of the interface 26 in the conventional manner.

The underside of interface 26 shown in FIG. 3 shows the same concentric rings of groups of pogo pads 28, entry vias 30, routing vias 32 and exit vias 34. The exit vias 34 lie inside a circle of copper cladding 38 which is applied on the surface of the insulating layer 40 of interface 26. A series of mounting holes 42 provide means to bolt a vertical pin probe device to interface 26.

The interface 26 shown in the drawings is greatly simplified in order to reduce the complexity of the drawings so that the invention may be more clearly understood. For example, there may be eight pogo pads in each group. In actual practice there are a great many more groups of pogo pads, entry vias, routing vias and exit vias circumferentially spaced around the concentric rings than are shown in the drawings. Also, the number of layers in the multiple layer electrical interface has been reduced in the description to depict only four internal layers, whereas eight or more internal layers may be used in actual practice.

Figure 4:
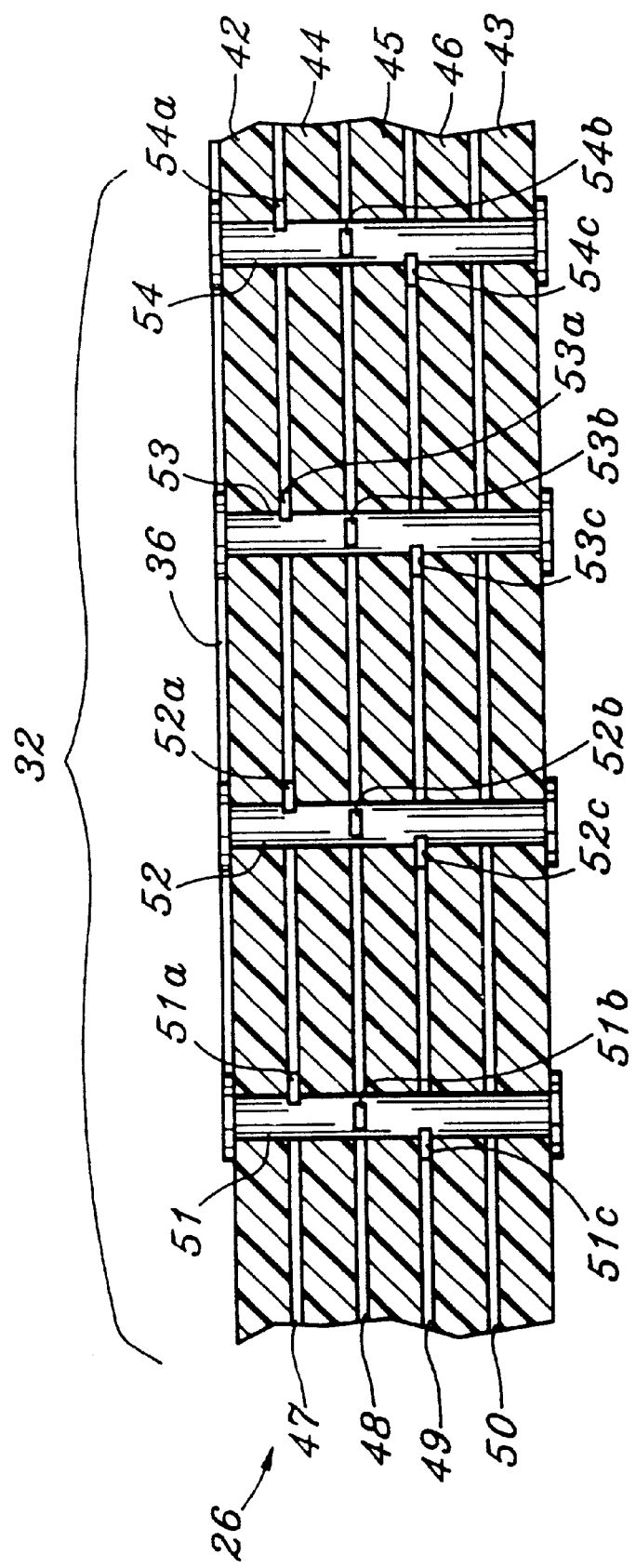

Reference to FIG. 4 illustrates a simplified form of multiple layer interface, taken through the group of routing vias 32 along lines IV—IV of FIG. 2. Referring to FIG. 4, the interface 26 is a laminated structure of insulating layers including exterior layers 42, 43 and interior layers 44, 45, 46. The insulating layers may be composed of conventional insulating material, having a thickness on the order of 0.006 inches. Interposed between the insulating layers are interior trace layers of multiple individual traces 47, 48, 49, 50. The trace layers may be composed of conventional conductive trace material, having a thickness on the order of 0.002 inches. On top of the top exterior insulating layer 42 is a layer of traces, such as the previously described trace 36 leading from a routing via to an exit via.

Each of the group of routing vias 32 comprises electrically conductive posts 51–54, preferably hollow tubes, extending through the insulation and held in place by expanded or swaged heads on either end. Vias 51–54 serve not only to provide a transition connection from layer to layer, but also serve as universally connected, selectively disconnectable circuit routing devices according to the present invention.

Each of the internal trace layers is comprised of separate traces, such as the traces 47–50. One of the traces 47 in the first internal layer depicted in FIG. 4 is connected to each of the four routing vias 51–54 at internal junctions 51a–54a respectively. One of the traces 48 in the second internal trace layer is connected to each of the routing vias 51–54 at internal junctions 51b–54b respectively. One of the traces 49 in the third internal layer is connected to each of the routing vias 51–54 at internal junctions 51c–54c respectively. Lastly, one of the traces 50 in the fourth internal layer is connected to each of the routing vias 51–54 at internal junctions 51d–54d respectively (see FIG. 6).

In accordance with one aspect of the present invention, the internal junctions are axially spaced along the via and also circumferentially spaced around the via.

Figure 5:
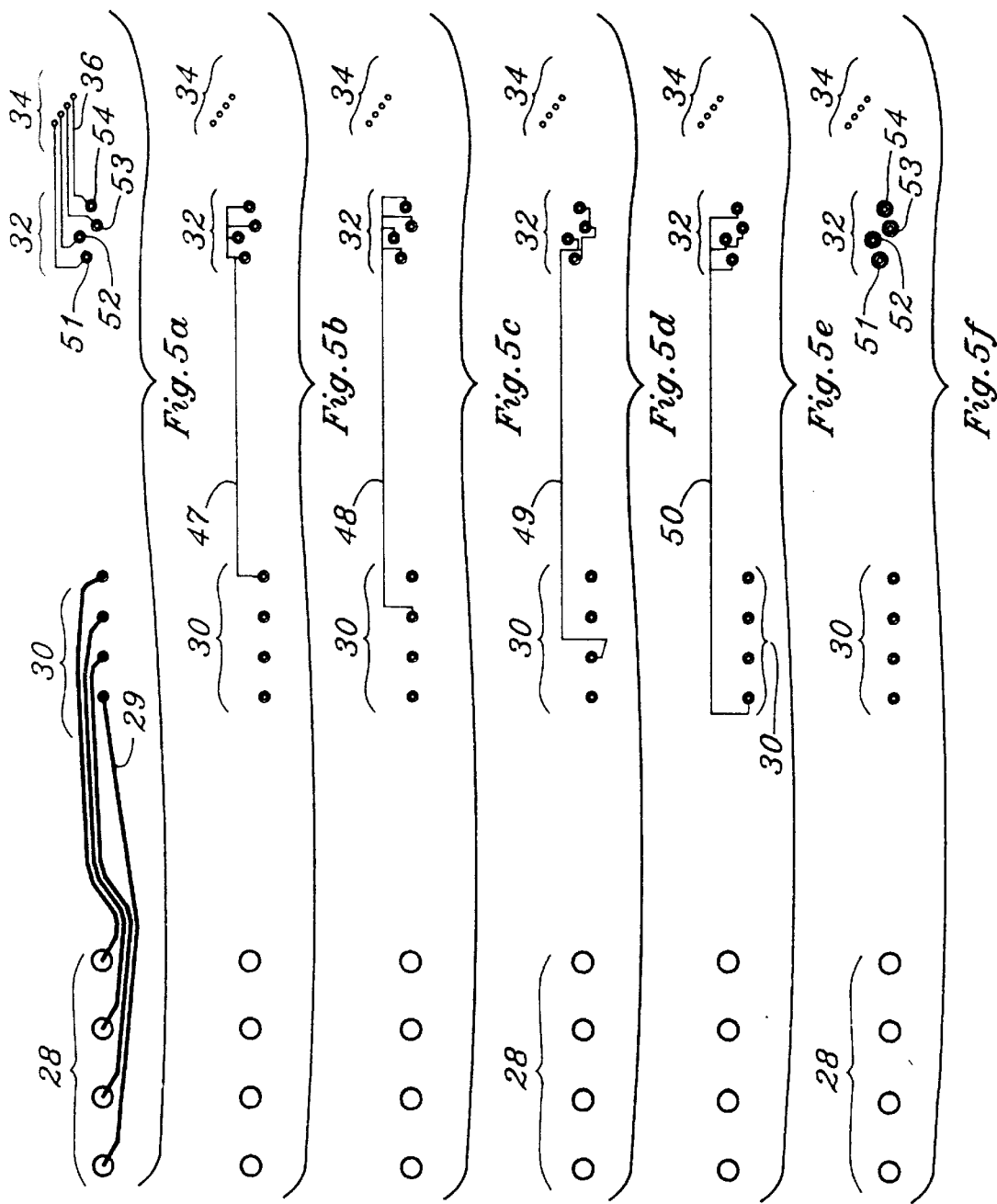

The schematic diagram of FIGS. 5a–5f illustrates the layout of external and internal traces within the portion of interface 26 enclosed by phantom lines V in FIG. 2. FIG. 5a is the top exterior layer of traces, which are seen from the outside of the board. FIG. 5b is the first interior layer showing that one of the entry vias 30 is connected by trace 47 to all of the routing vias 32. FIG. 5c is the second interior layer showing that a different entry via 30 is connected by trace 48 to all of the routing vias 32. Similarly, FIGS. 5d and 5e illustrate the connections by means of traces 49 and 50 from one of the entry vias to all of the routing vias 32 in that layer. FIG. 5f illustrates the bottom exterior layer appearance. No connections are provided by traces prior to customization. However it should be noted that the group of exit vias 34 lie within the copper layer 38, whereon traces will be provided by laser cutting and removal of copper when the interface 26 is customized.

Figure 6:
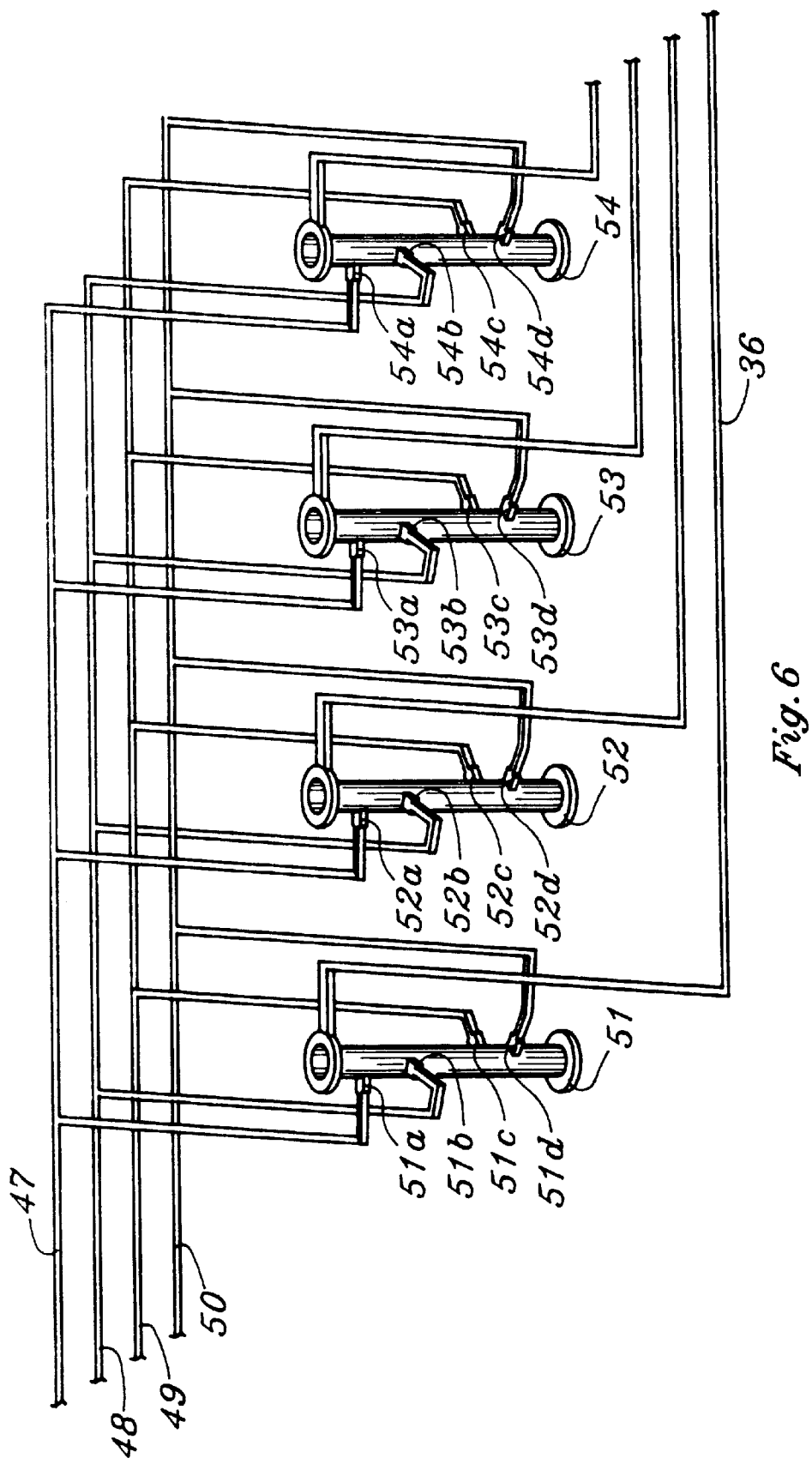

Referring now to the perspective view of FIG. 6, the routing vias 51–54 are illustrated schematically to show the arrangement of the internal junctions 51a . . . 54d which are spaced both circumferentially and axially on the vias. The routing vias 51–54 are universally connected to the entry vias in each internal layer, so as to permit any of the internal traces 47–50 to be connected to any of the external traces 36 without interference with other circuit paths. The universally connected vias are selectively disconnected by means of severing the unwanted internal junctions.

CUSTOMIZATION OF THE UNIVERSAL INTERFACE

While FIGS. 2–6 depict the universal interface prior to customization, FIGS. 7–10 depict the same board after customization or dedication to a particular integrated circuit.

In accordance with the present invention, the interface 26 is customized by means of a laser or high pressure water cutting system or other fine line cutting tool or mechanism. The design of the routing vias with internal junctions spaced along and around the via facilitates this process. The routing via is designed such that a cutting tool may sever the via from one or all of the inner layers of the printed circuit board.

Figure 7:
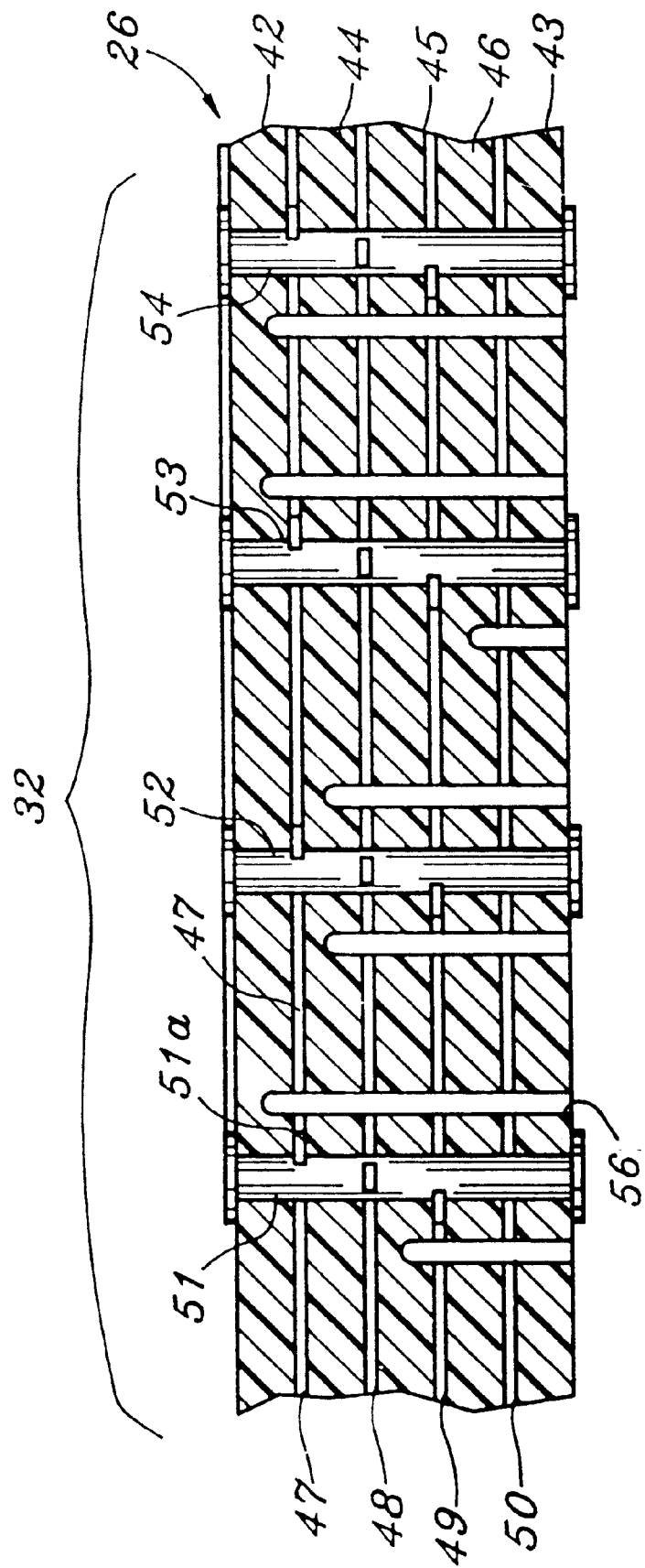
FIG. 7 is a side elevational view in cross section similar to FIG. 4.

Referring to FIG. 7 of the drawing, the same cross section of the routing vias in group 32 is shown as in FIG. 4 However a computer-guided laser/cutting tool has been used to sever selected internal junctions, so that selected traces are no longer connected to the via at selected internal junctions. By means known in the laser cutting art, both the depth and the X-Y position of the laser beam or high pressure water cutting tool may be used to penetrate the laminated structure from the underside, as illustrated by the laser drilled opening 56, which severs junction 51a connecting via 51 to trace 47. (See also FIG. 8).

Figure 8:
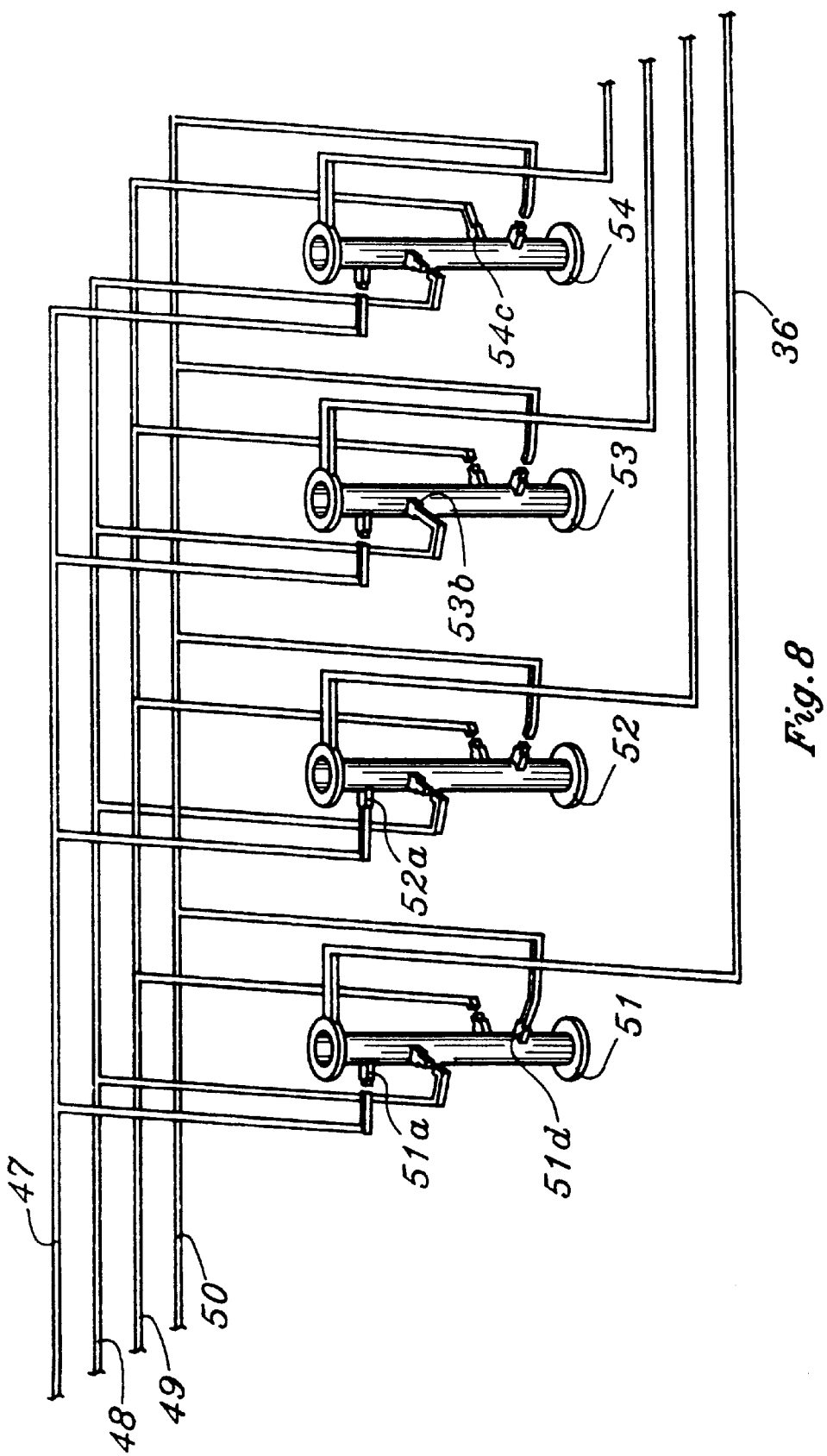
FIG. 8 is a perspective view of the routing vias similar to FIG. 6.

Reference to FIG. 8 of the drawing shows that three of the four junctions have been severed, leaving trace 47 connected to via 51 only at junction 51d. Similarly, three of the four internal junctions on via 52 have been severed leaving only 52a connected to the via. Similarly, three of the four internal junctions have been severed at via 53, leaving only junction 53b connected. Lastly, three of the four internal junctions at via 54 have been severed, leaving only junction 54c connected at via 54. As seen in FIG. 8, after selectively disconnecting the unnecessary internal traces from the vias by severing all but the desired internal junction, only one internal trace is left connected to each of the external traces. For example, internal trace 50, which might comprise the power layer of internal traces, for example, is connected only to external trace 36 by means of internal junction 51d and via 51.

Figure 9:
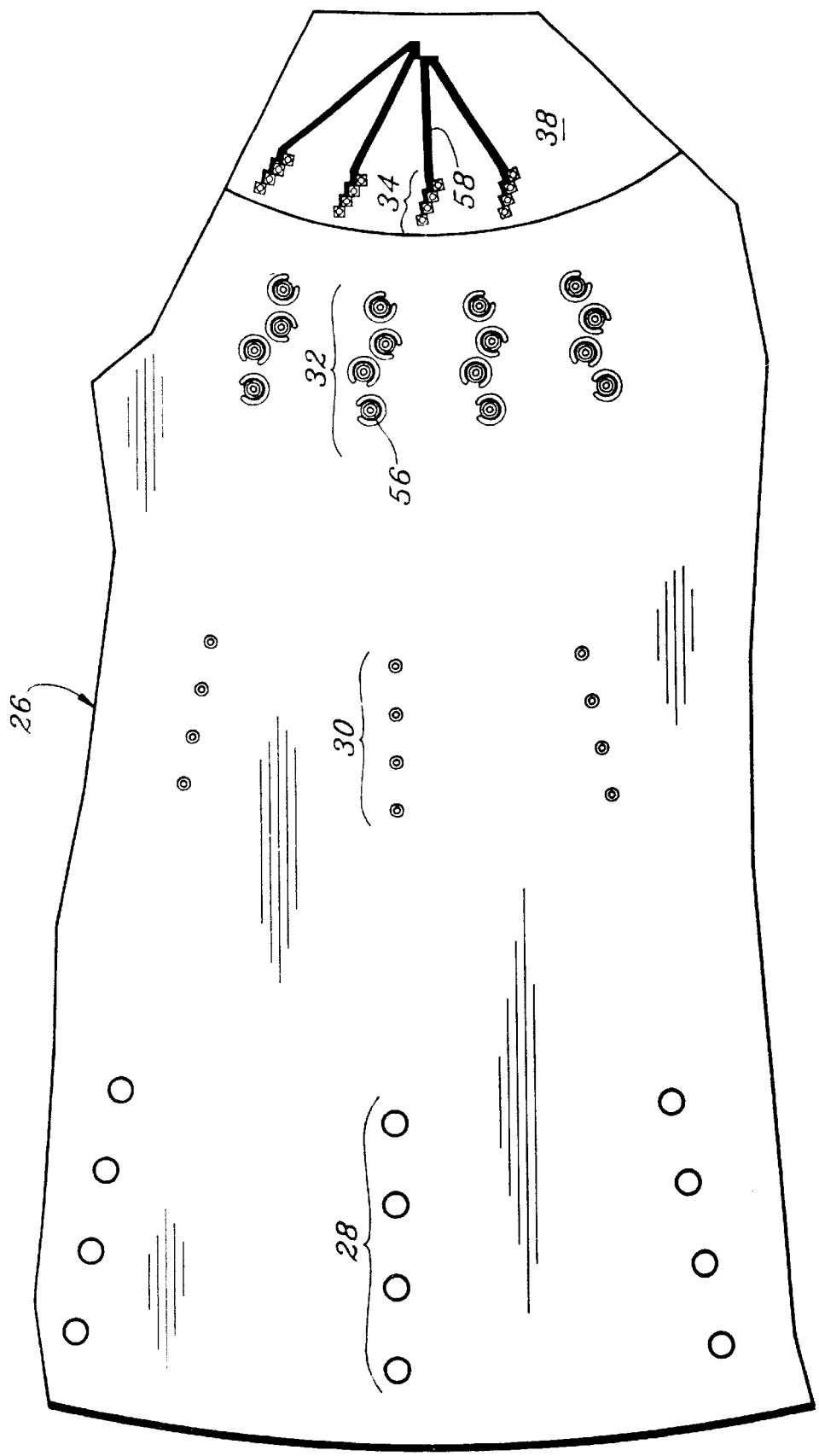
FIG. 9 is a bottom plan view of a portion of the interface continued to the portion enclosed by phantom line IX in FIG. 3.

FIG. 9 depicts a portion of the interface enclosed by phantom line IX in FIG. 3. FIG. 9 illustrates the path left by a computer guided laser cutting tool at reference numeral 56. The path cut by the laser may be arcuate or along the lines of a polygon, as guided by a computer aided positioning device, and depending upon the circumferential spacing of internal junctions and upon the number and thickness of layers in the interface.

While selective severing of internal junctions at the routing vias enables a selected connection between one of the entry vias 30 and one of the exit vias 34, there remains the job of connecting an exit via to the pin-out pattern or "footprint" of the device under test. As previously noted, exit vias 34 are located on the underside of the board within the copper cladding section 38. In accordance with another aspect of the present invention, the traces connecting an exit via 34 to a precise pin location which will be contacted by the vertical pin probing device is done by using laser, water or other means of cutting the continuous copper coating 38 to leave a trace between cuts. Present printed circuit board technology is limited to an approximately 0.004 inches wide trace. By using laser cutting technology to remove copper, leaving a trace, the width of the trace may be reduced to less than 50 microns. The laser beam leaves a space between traces that is also less than 50 microns. The pitch and trace width of a laser or water cut interface/printed circuit board is dictated by the minimum cutting beam width and the power of the laser cutting system itself. Using a computer guided laser cutting tool, individual traces are provided for each of the exit vias 34, one of which is shown at 58.

Figure 9A:
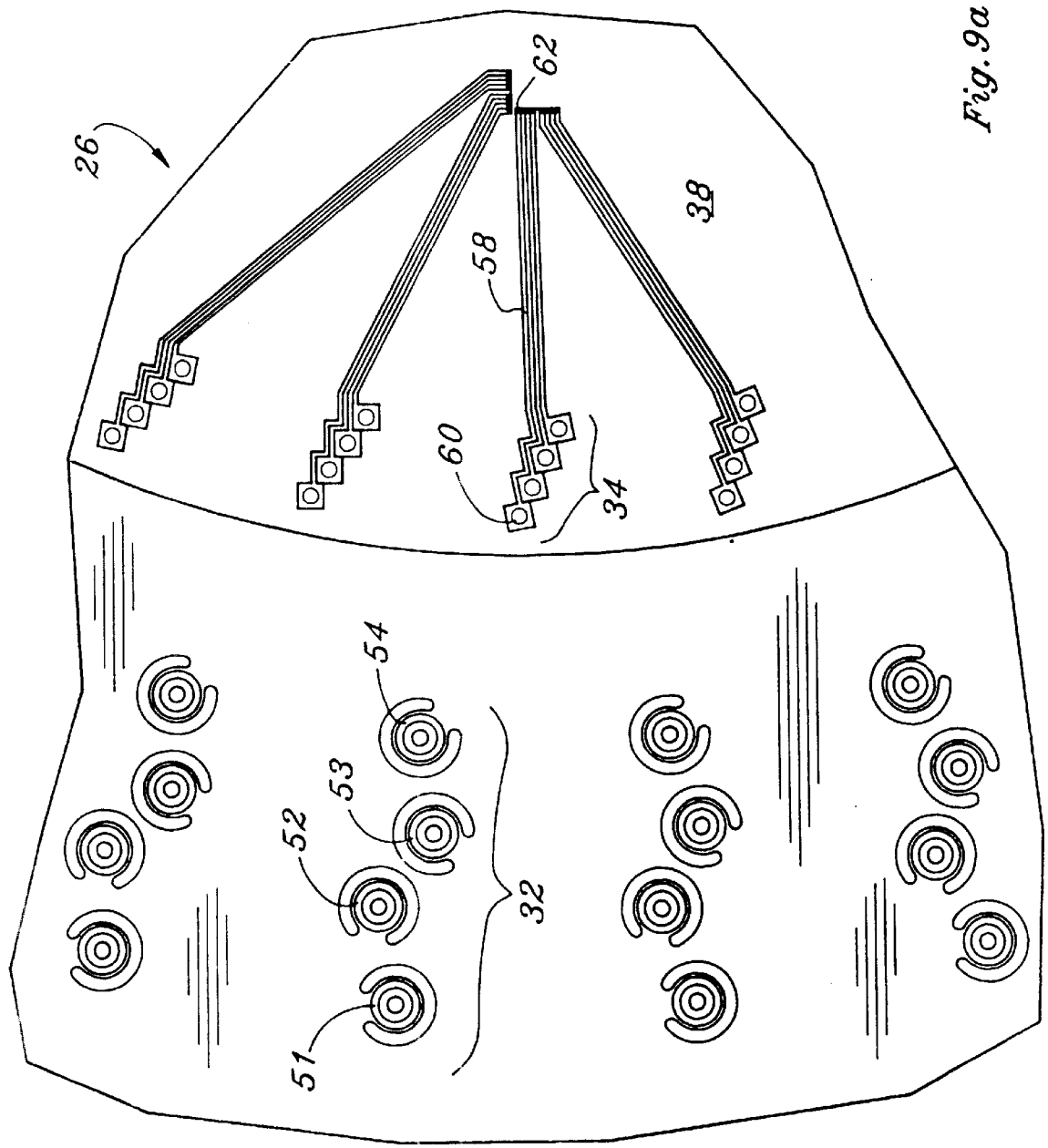
FIG. 9a is an enlarged detail view of a portion of FIG. 9.

Referring to the detailed drawing of FIG. 9a, a customized interface 26 shows that one of the exit vias in group 34, indicated by reference numeral 60 is connected to a probe pin contact point 62. Contact point 62 forms part of the "footprint" of the device under test, and will be contacted by the head of the probe pin in the vertical pin probing device attached to interface 26. The trace 58 connects exit via 60 to probe pin contact point 62. The trace 58 is formed by laser cutting on either side of the trace, around the contact point 62 and around the end of the exit via 60, so as to leave 60 and 62 connected together. By grouping the probe pin contact points and by grouping the exit vias as shown, a single 50 micron laser cut may be used to successively separate two 50 micron traces.

A schematic circuit diagram is shown in FIG. 10. Four entry vias are shown as 30*a*, 30*b*, 30*c*, 30*d*. Four exit vias are shown as 34*a*, 34*b*, 34*c*, 34*d*. By means of the selective severing of internal junctions previously described in FIGS. 7 and 8, the circuit connections are made according to the following table:

| From Entry Via | Along Interior Trace | Through Routing Via | To Exit Via |
|---|---|---|---|
| 30a | 50 | 51 | 34d |
| 30b | 49 | 54 | 34a |
| 30e | 48 | 53 | 34b |
| 30d | 47 | 52 | 34e |

Since the circuit paths are along traces in different layers, the paths can cross over one another without interference. The illustrated embodiment of the invention in the universally connected interface connects all of the routing vias to By each of the entry vias, and then connects each of the routing vias only to a respective exit via. The concept is equally applicable if all of the routing vias are connected to each of the exit vias, and then each of the routing vias is connected only to a respective entry via. In this case, the circuit paths between exit vias and routing bias would be laid out in separate layers while the connections between entry vias and routing vias could be laid out on one layer.

While the illustrated embodiment shows the traces 36 on an external layer, they could also be located in an additional internal layer. In such case traces 36 would not be visible in FIG. 2.

Through the aforedescribed customizing process, consisting of severing internal junctions at the routing vias and by laser cutting a copper clad section of the interface, the universal interface may be customized for a particular "footprint" of the device under test, so as to connect any of the pogo pads at the periphery of the board to any of the probe pin contact locations.

OPERATION AND ADVANTAGES OF THE INVENTION

The layout of the vias is consistent from one universal design to another. This is done to minimize the amount of custom software and maximize the output of the custom routing program. This consistency also minimizes the amount of tooling required to change from one universal interface blank to another, as all the mounting and tooling holes are consistent from one universal interface blank to another.

The universal interface is designed to the specifications of each semiconductor tester model. The outer layers of the universal blank are all "plane" which electrically shorts together all vias on the universal interface blank. The routing vias also connect to any or all inner layers of the universal blank. The output file from the auto-routing software, driving the cutting system, is then used to sever the vias from the "plane" and the inner layers of the universal interface blank. Signal power and ground paths are then cut into the universal blank using the layout of vias as described. This enables the universal blank to be specifically dedicated to the pin-out of the semiconductor device by post-fabrication and customization of the universal interface blank, in such a manner that each signal, power and ground path is optimized for electrical performance.

While there has been described what is considered to be the preferred embodiment of the invention, other modifications will occur to those skilled in the art, and it is desired to secure in the appended claims all such modifications as fall within the true spirit and scope of the invention.

What is claimed is:

1. A multiple layer, universally connected and selectively disconnectable electrical interface comprising:

a laminated structure including a plurality of insulating layers and a plurality of trace layers alternating therewith, each trace layer comprising a plurality of traces, a plurality of electrically conductive routing vias extending through the insulating layers of the laminated structure, each said routing via being connected to one of said traces in preselected first trace layers by a plurality of first junctions, each said routing via also being connected to a second selected trace in a second trace layer by a second junction, each of said plurality of first junctions between a trace and a routing via being spaced from each other on the same routing via such that selected first junctions may be selectively severed at a selected routing via to leave a first selected trace in a first trace layer connected to a second selected trace in said second trace layer, first and second terminal means accessible from the outside of the laminated structure, and first and second circuit means electrically connecting the first and second terminals respectively to said first and second selected traces.

2. The interface according to claim 1, wherein said preselected trace layers are disposed between insulating layers and wherein the junctions are internal junctions.

3. The interface according to claim 1, wherein the junctions between traces and the routing via are circumferentially spaced around the routing via.

4. The interface according to claim 1, wherein the junctions between traces and the routing via are axially spaced along the routing via.

5. The interface according to claim 1, wherein the junctions between traces and the routing via are both circumferentially spaced and axially spaced on the routing via.

6. The interface according to claim 1, wherein at least one of the first and second selected traces is in a trace layer which is disposed on the exterior of the laminated structure.

7. The interface according to claim 1, wherein at least one of the first and second selected traces is in a trace layer disposed between insulating layers on the interior of the laminated structure.

8. The interface according to claim 1, wherein at least one of the first and second circuit means comprises an additional via extending through the insulating layers and connecting a respective terminal to a respective selected trace.

9. A multiple layer, universally connected and selectively disconnectable electrical interface comprising:

a laminated structure including a plurality of insulating layers, including exterior and interior insulating layers, said insulating layers having disposed thereon a plurality of trace layers, each trace layer comprising a plurality of traces, a plurality of first vias disposed in a first group accessible from an exterior insulating layer, each of said first vias being connected to a respective first selected trace in one of said trace layers, a plurality of second vias disposed in a second group accessible from an exterior insulating layer, each of said second vias being connected to a respective second selected trace in one of said trace layers, a plurality of routing vias disposed in a third group and extending through the laminated structure between opposed exterior insulating layers, each said routing via being connected by means of a plurality of first junctions to all of the first selected traces, each said routing via being also connected by means of a second junction to a second selected trace, said first junctions being circumferentially and axially spaced on the routing via such that all but one of said first junctions may be selectively severed by cutting partially around and partially along the side of said routing via to connect selected first vias in the first group to selected second vias in the second group.

10. The interface according to claim 9, wherein said first selected traces are in trace layers which are disposed between insulating layers and wherein the first junctions are all internal junctions.

11. The interface according to claim 9, wherein said laminated structure includes a trace layer comprising a plurality of external traces disposed on an exterior insulating layer and wherein the second selected traces and the second junctions are external of the laminated structure.

12. The interface according to claim 9, including a plurality of terminal means each connected by an external trace to one of said plurality of first vias.

13. The interface according to claim 9, including a plurality of terminal means each connected by an external trace to one of said plurality of second vias.

* * * * *